United States Patent [19]

Yoo et al.

[11] Patent Number: 5,578,517

[45] Date of Patent: Nov. 26, 1996

[54] METHOD OF FORMING A HIGHLY TRANSPARENT SILICON RICH NITRIDE PROTECTIVE LAYER FOR A FUSE WINDOW

[75] Inventors: Chue-San Yoo; Jin-Yuan Lee, both of Hsin Chu, Taiwan

[73] Assignee: Taiwan Semiconductor Manufacturing Company Ltd., Hsin-Chu, Taiwan

[21] Appl. No.: 328,587

[22] Filed: Oct. 24, 1994

[51] Int. Cl.⁶ .............................. H01L 27/00; H01L 21/70
[52] U.S. Cl. ..................... 437/60; 437/922; 148/DIG. 55
[58] Field of Search .............. 437/922, 60; 148/DIG. 55

[56] References Cited

U.S. PATENT DOCUMENTS

| | | | |
|---|---|---|---|
| 4,536,949 | 8/1985 | Takayama et al. .................... | 29/578 |
| 5,025,300 | 6/1991 | Billig et al. .............................. | 357/51 |
| 5,093,174 | 3/1992 | Suzuki et al. ............................ | 428/64 |
| 5,241,212 | 8/1993 | Motonami et al. ...................... | 257/529 |

*Primary Examiner*—H. Jey Tsai
*Attorney, Agent, or Firm*—George O. Saile; Willliam J. Stoffel

[57] ABSTRACT

An integrated circuit includes a conductive fusible link that may be blown by heating with laser irradiation. The integrate circuit comprises: a silicon substrate; a first insulating layer; a fusible link on the first layer; a second insulating layer overlying the first layer and the fusible link; an opening through the second layer exposing the fuse; and a protective layer over the surfaces of the opening. A laser beam is irradiated through the opening and the protective layer to melt the fusible link. The protective layer is highly transparent to a laser beam and does not interfere with the laser melting (trimming) operation. Moreover, the protective layer prevents contaminates from diffusing in through the opening to harm adjacent semiconductor devices.

22 Claims, 3 Drawing Sheets

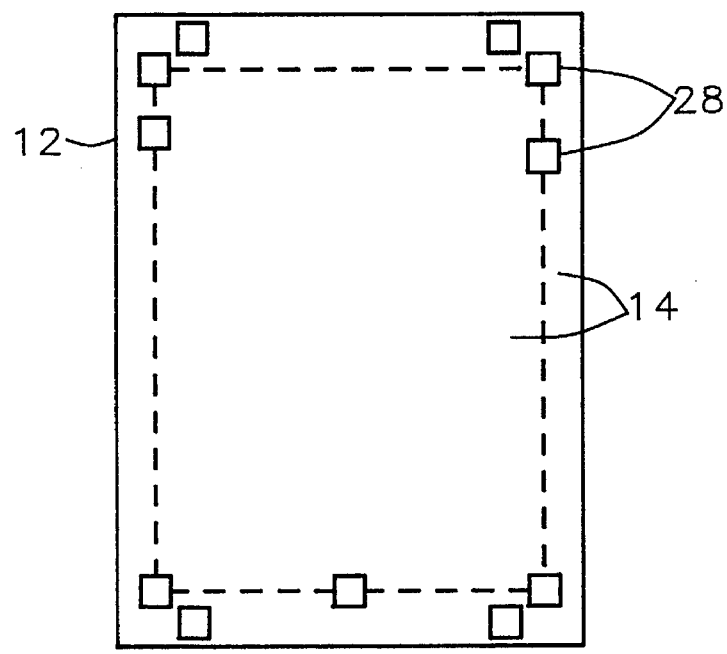
FIG. 1
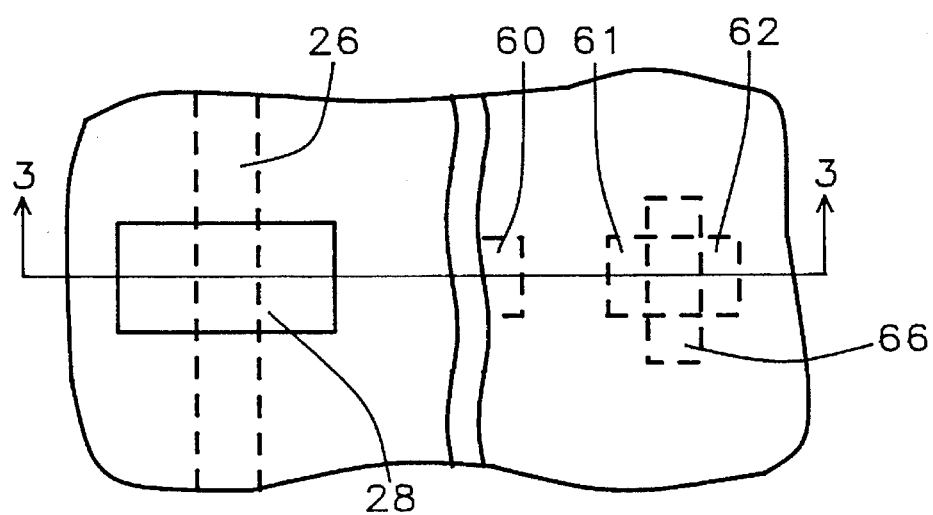
FIG. 2 - Prior Art

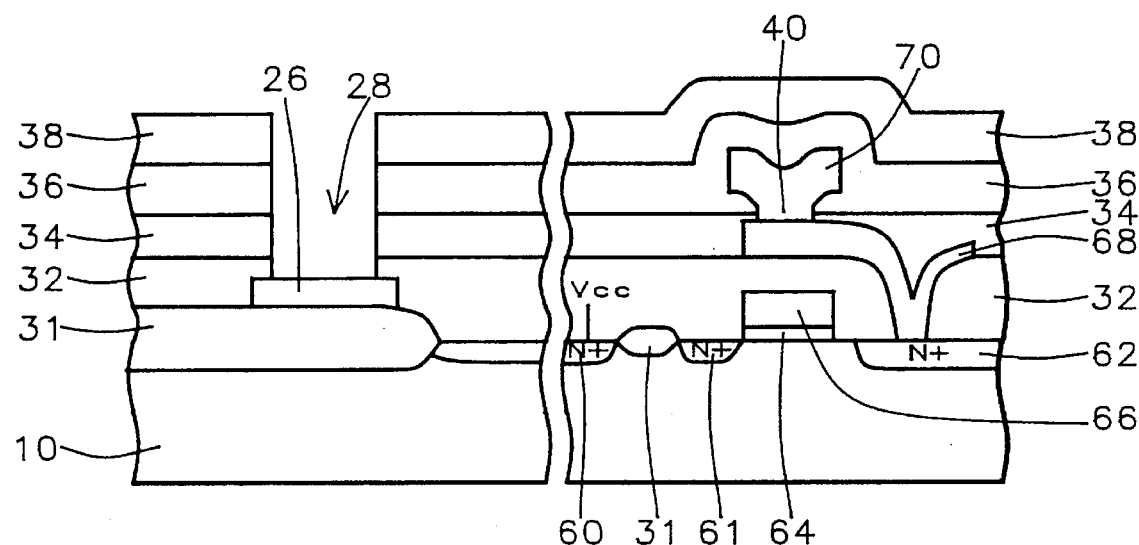
FIG. 3 – Prior Art
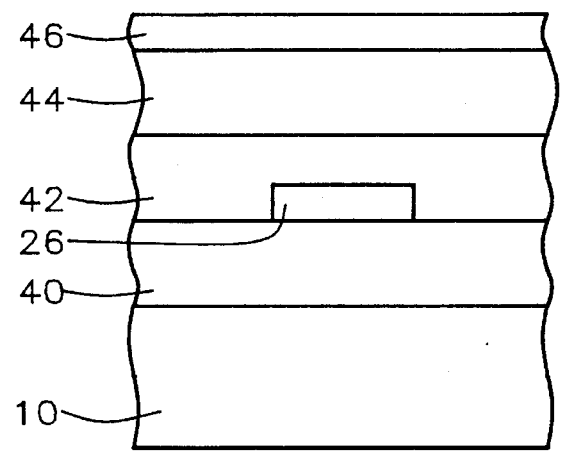
FIG. 4

METHOD OF FORMING A HIGHLY TRANSPARENT SILICON RICH NITRIDE PROTECTIVE LAYER FOR A FUSE WINDOW

BACKGROUND OF THE INVENTION

1) Field of the Invention

This invention relates to integrated circuits and semiconductor devices. It relates particularly to a structure and method for producing integrated circuits having an improved contamination passivation film for surface features, such as fusible links and photo alignments marks.

2) Description of the Prior Art

Fusible conductive links (fuses) are often used in rewiring electrical circuits to replace defective devices with redundant devices. These circuits are rewired by rendering the fuses non-conductive (i.e., blown) by applying laser energy to the fuse with a laser trimming machine.

In dynamic or static memory chips, defective memory cells may be replaced by blowing the fuses associated with the defective cells, and activating a spare row or column of cells. This circuit rewiring using fusible links considerably enhances yields and reduces the production costs.

Logic circuits may also be repaired or reconfigured by blowing fuses. For example, it is common to initially fabricate a generic logic chip having a large number of interconnected logic gates. Then in a final processing step, the chip is customized to perform a desired logic function by disconnecting the unnecessary logic elements by blowing the fuses that connect them to the desired circuitry. Still other applications of laser-blown fuses are possible.

Semiconductor chips often have openings through protective insulating layers over fusible link regions to allow a laser to irradiate the fuse. But these openings frequently lowers chip yields and reliability by allowing contamination to penetrate from the openings to the device regions.

FIG. 1 shows a top plan view of a semiconductor chip 12 with openings 28 over fusible links surrounded by active device areas 14. A conventional fusible link (i.e., fuse) 26, a fusible link opening 28 and an adjacent device region 60, 61, 62, 66, is shown in top plan view FIG. 2. Referring to FIG. 3, a cross-sectional view of the same link and device regions in FIG. 2 taken along horizontal axis labeled 3 is shown.

An important challenge is to improve the reliability of the semiconductor devices surrounding fusible links, especially when a large number of the fusible link openings 28 are on a chip 12. A window opening 28 is normally formed through the insulating layers over a fuse 26 so that a laser beam can be used to irradiate the fuse, thereby blowing it. A problem with openings 28 over a fusible link regions is that moisture and other contaminates can diffuse from the openings, through the insulating layers, into the semiconductor devices thus reducing circuit reliability and yields.

As shown in FIG. 3, fuse 26 is normally formed over thick field oxide regions 31 in a semiconductor substrate 10. Fuse 26 is formed over the field oxide regions 31 to prevent shorting of the fuse 26 to the substrate 10. Fuse 26 can be formed of a metal, such as aluminum, platinum silicide, titanium tungsten, polysilicon, or a polycide, such as titanium polycide, tungsten polycide or molybdenumpolycide. Layers 32, 34, 36, 38 are insulating (passivation or dielectric) layers, such as borophosphosilicate glass (BPSG), spin on glass, silicon oxide and silicon nitride respectively.

Opening 28 is formed over the fuse 26 area through the insulating layers 32, 34, 36, 38. Opening 28 can have a width of 5 microns and a length of 5 microns. An adjacent semiconductor device is shown with buried N+ regions 60, 61, 62, gate oxide 64, gate 66, via 40 and metal layers 68, 70.

A laser is used to blow the fuses 26. The laser is focused through the fuse opening 28 and irradiates the fuse 26. It is conventional to have an opening 28 over the fuse 26 in the area where the fuse 26 will be broken so that the laser heating will be more effective. Because the passivation layers overlying a fuse 26 would reduce the laser energy striking the fuse, the passivation layers are etched away so that the fuse 26 is exposed or, in an alternative, only single thin insulating layer or a portion of a thin insulating layer covers the fuse.

The fuse 26 absorbs the heat from the laser irradiation and the fuse melts. In this operation, sometimes called laser trimming, the rapid temperature rise of the upper portion of the fuse 26 causes an increase in pressure. This pressure cause any overlying film 32 to be "blown off" and the melted polysilicon fuse is removed by evaporation. Laser trimming requires that only a very thin insulating layer cover the fuse because the laser must be able to penetrate the layer and melt the fuse. The portion of the fuse 26 and thin insulating layer 32 over the fuse which is melted away or "blown" must not deposit on or interfere with near-by devices. In the example shown in FIG. 3, an opening 28 is formed through four layers: Silicon nitride 38, silicon oxide 36, spin on glass 34 and borophosphosilicate glass (BPSG) layer 32.

A major problem with a window opening in the passivation layers is that moisture and contamination can enter through the exposed passivation layers and diffuse to the semiconductor devices. The diffused moisture and contaminates can decrease device reliability and yields. Moreover, moisture is present in the air and sodium (Na+ ions) are plentiful in the environment.

As shown in FIG. 3, moisture and other contaminates can enter through the window 28, diffuse into spin on glass layer 34 and diffuse to the adjacent semiconductor devices 31, 40, 64. Water will attack the metal interconnects 70, and sodium and other contaminates can harm MOS devices 31, 64.

First, water can attack the metal interconnects 70, with the following reaction:

$$3\ H_2O + Al \rightarrow Al(OH)_3 + 3/2\ H_2$$

The formation of $Al(OH)_3$ causes the resistance of metal interconnects 70 to increase and finally causes circuit failure.

Second, contamination can harm MOS devices. FIG. 3 shows an opening 28, buried N+ regions 60, 61, 62, field oxide 31, gate oxide 64, polysilicon gate 66, and metal layers 68, 70. Mobile ions, such as sodium ions, can diffuse through inter-metal dielectric layer 34, and through the insulating layer 34 into the field oxide layer 31. Mobile ions in the field oxide layer 31 can cause field inversion which allows an undesired leakage current between adjacent buried N+ (or P+) regions 60, 61 resulting in circuit failure. Also, mobile ions in the gate oxide 64 will cause a transistor threshold shift whereby the circuit fails.

The following three U.S. Patents show fusible link structures, but do not adequately solve the problem of contamination diffusing through the window opening to adjacent devices and not interfering with the laser trimming operation.

Billig et all, U.S. Pat. No. 5,025,300 teaches an integrated circuit where a very thin protective dielectric layer composed of silicon dioxide, silicon nitride or silicon oxynitride, is formed over the fuse in a window (Billig, Col. 4, lines 58–61). The dielectric layer has a thickness that allows the laser to penetrate, but the layer reduces the laser energy to the fuse, potentially preventing the laser from blowing the fuse. Also, because the dielectric layer interferes with the laser irradiation, its thickness uniformity must be tightly controlled to allow consistent laser cutting from fuse to fuse. In another embodiment of Billig, a thin protective dielectric layer is formed after the fuse is blown. This invention prevents shorts between conductors that otherwise might occur due to debris from the fuse-blowing operation. This embodiment has tradeoffs since the extra protective layer must be removed from some device surfaces, for example, over metal bonding areas. Also, forming the extra layer and partial removal steps add cost.

Takayama, U.S. Pat. No. 4,536,949 discloses a method of forming an opening over fuses where each insulation layer is etched separately yielding a more accurate opening. However, the problem of contamination diffusing to the devices through the exposed sidewalls of the opening still exists.

Motonami, U.S. Pat. No. 5,241,212, discloses a protective layer covering an opening through a single insulating layer for a fuse. In one embodiment, the protective layer only covers the surface of the protective layer, but leaves the sidewall of the insulating layer exposed for contamination to diffuse through. In a second embodiment, the protective coating covers the top of the isolation layer, the sidewalls of the fuse opening and also covers the isolation over the fuse and the fuse. Unfortunately, the protective layer over the fuse inhibits the laser from heating the fuse which can cause problems in consistently laser trimming (blowing) the fuse.

Thus, it is desirable to find a solution that prevents contamination from entering into the sidewalls of the openings, but does not interfere with the laser irradiation which heats the fuse in the laser trimming operation.

SUMMARY OF THE INVENTION

It is a general object of the invention to provide an improved structure and method for forming a protective layer over a fuse and fuse window of an integrated circuit.

An more specific object of the present invention is to provide an improved structure and method for forming an protective layer which prevents contamination from diffusing through a window opening over a fuse where the protective layer is has a high transmittance of laser energy used in laser trimming operations.

In accordance with the above objects, a structure and technique for forming a protective layer, with a high transmittance to laser energy, over a fusible link is provided.

A first insulating layer is formed on a semiconductor substrate. Next, a fuse is formed on the first insulating layer. At least one additional layer of insulating material is formed over first insulating layer and the fuse. A window opening over the fuse is formed at least partially through the second insulating layer which either exposes the fuse or exposes a portion of the second insulating layer over the fuse.

A protective passivation layer is formed over the top insulating layer, the sidewalls of the opening, portions of exposed second insulating layer, and the fuse. This protective insulating layer prevents contamination from entering into the insulating layer(s) while not interfering with the laser irradiation and trimming of the fuse.

The protective insulating layer, which has a greater than 50% transmittance of laser irradiation, is formed of silicon nitride which has a ratio of nitrogen to silicon from 1.2 to 1.6.

BRIEF DESCRIPTION OF THE DRAWINGS

The drawings show the following:

FIG. 1 is a top plan view in greatly enlarged scale that illustrates fusible link regions and active semiconductor device areas on a semiconductor chip.

FIG. 2 is plan view in broken section in greatly enlarged scale that illustrates a fusible link, fuse window, and adjacent semiconductor devices in accordance with the prior art.

FIG. 3 is cross-sectional view along axis 3 in FIG. 2, in broken section and in greatly enlarged scale that illustrates a fuse opening and adjacent semiconductor devices in accordance with the prior art process.

FIGS. 4 through 6 are cross-sectional views in broken section that illustrate a structure and a process for forming a fuse opening with a protective layer in accordance with the invention.

DETAILED DESCRIPTION OF THE PREFERRED EMBODIMENTS

Figure 5:
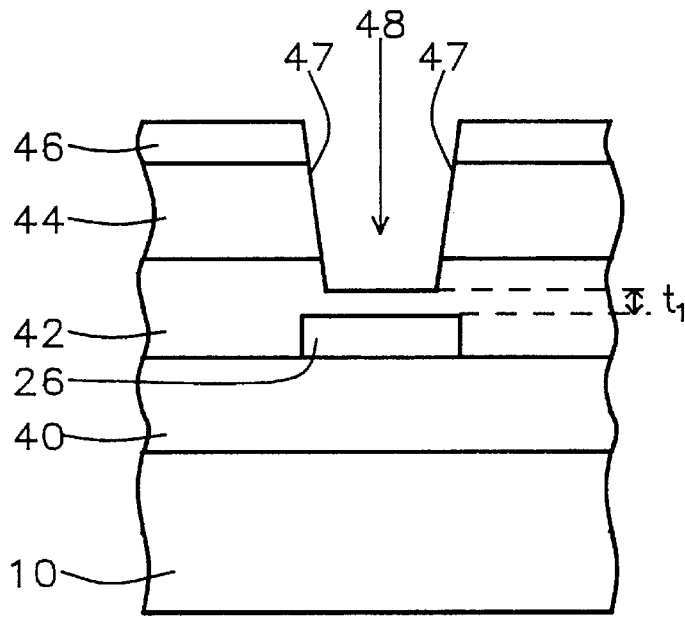

The following detailed description relates to an improved structure and technique for forming a protective layer over a fusible link and an opening in a passivation layer(s) for integrated circuits.

The method of the present invention will be described as a protective layer over an opening for a fuse and not by way of limitation. The protective layer of the present invention can be applied to other structures, such as alignment mark regions. Moreover, the location of the fuse in this description is on the first insulating layer, but the fuse may in practice by located on any insulating layer in the integrated circuit. Furthermore, four insulating layers are described in this invention, but in practice the actual number and composition of the layers may vary. Also, the composition, location and number of fusible links may vary in actual practice.

Referring to FIG. 4, a first isolating layer 40 is formed on portions a semiconductor substrate 10. First isolating layer 40 electrically isolates adjacent semiconductor devices from each other. The first insulating layer 40 is formed of a dielectric material and is preferably formed of thick silicon oxide, sometimes called field oxide. Silicon oxide can be grown at atmospheric pressure at a temperature of between 700° to 1200° C. in a wet or dry oxygen ambient in a thermal furnace. Layer 40 has a thickness in the range of 2000 to 8000 angstroms and preferably, a thickness of approximately 5000 angstroms.

A fusible link 26 is formed over the field oxide 40. The fusible link 26 is part of a patterned metal layer formed of over the first insulating layer 40. The field oxide 40 isolates the fusible link from adjacent devices and most importantly, from the substrate 10. Alternatively, the fusible link 26 can be formed over other layers, such as a borophosphosilicate glass (BPSG) layer (e.g., layer 42). The BPSG layer can be grown by conventional plasma enhanced chemical vapor deposition (PECVD) or atmospheric pressure chemical vapor deposition (APCVD) and has a thickness in the range of 3000 to 15,000 Å.

Fuse 26 can be formed of a metal, such as aluminum, platinum silicide, titanium tungsten, or polysilicon. Also, fuse 26 can be formed of a polycide, such as titanium polycide, tungsten polycide, and molybdenum polycide. Fuse 26 typically has a thickness in the range of 500 to 5000 angstroms and a length in the range of 5 to 10 microns and a width in the range of 1 to 3 microns. Fuse 26 can be "blown" by applying laser energy which allows redundant circuit devices to be activated and replace defective devices.

Next, a second insulating layer 42 is formed at least partially covering the fuse 26 and the first insulating layer 40. Second insulating layer 42 is formed of a dielectric material and can be formed of borophosphosilicate glass, phosphosilicate glass, silicon oxide, or other suitable insulating material. Borophosphosilicate glass can be formed by atmospheric pressure chemical vapor deposition (APCVD) of tetraethylorthosilicate (TEOS) according to principles known in the art. Boron and phosphorus are added to the ambient during the formation of the borophosphosilicate glass layer. The layer 42 is thermally treated at a temperature of 850° C. for 30 minutes to cause flow and planarization. Second insulating layer 42 can have thickness in the range of 3000 to 15,000 angstroms and preferably a thickness of approximately 6000 angstroms (Å).

Afterwards, a third insulating layer 44 is formed overlying the second insulating layer 42. Moreover, third insulating layer 44 has a thickness in the range of 5000 to 20,000 angstroms and preferably a thickness of approximately 10,000 angstroms.

Third insulating layer 44 can be formed by at least four alternate processes. First, layer 44 can be formed of a two layer structure with a PECVD layer and a spin on glass (SOG) layer. The layers can be applied in any order (i.e., SOG-PECVD or PECVD-SOG). Spin on glass layers can be formed using a siloxane or silicate, which is deposited, baked and cured at approximately 400° C. Silicon oxide is deposited by plasma enhanced chemical vapor deposition (PECVD). Both the SOG and PECVD layers can be etched back.

In the second process, layer 44 can be formed by making a three layer sandwich structure of a) silicon oxide, b) spin on glass and c) silicon oxide. The bottom silicon dioxide layer can be deposited using plasma enhanced chemical vapor deposition (PECVD)) by reacting silane and nitrous oxide in an argon plasma at 200° to 450° C. The bottom silicon dioxide layer has a thickness of approximately 2000 Angstroms. The middle spin on glass (SOG) layer can be formed using a siloxane or silicate, which is deposited, baked and cured at approximately 400° C. The middle spin on glass layer has a thickness of approximately 3000 Angstroms. The top silicon oxide layer has a thickness of approximately 5000 angstroms and is formed using the same processes described above for the bottom silicon oxide layer. The overall thickness of layer 44 is in the range of 7000 to 20,000 angstroms.

Third, layer 44 can be formed of an oxide formed by an electron cyclotron resonance (ECR) process. Fourth, layer 44 can be formed of an oxide formed by a conventional tetraethylorthosilicate (TEOS) process.

As shown in FIG. 4, a fourth insulating layer 46 is formed over the third insulating layer 44. Layer 46 can be formed of silicon oxide or silicon nitride deposited by plasma enhanced chemical vapor deposition (PECVD). Layer 46 has a thickness in the range of 2000 to 10,000 angstroms and preferably a thickness of 5000 angstroms.

Referring to FIG. 5, an opening 48 over fuse 26 is formed with vertical sidewalls exposing portions of the second 42, third 44, and fourth 46 insulating layers. Opening 48 also has a bottom surface comprised of second insulating layer and/or the fuse 26. Opening 48 can extend down to fuse 26 thus exposing the fuse 26. Moreover, Opening 48 can be formed using conventional photolithography and etching techniques, such as a reactive ion etch process using $CHF_3$/$CF_4$/$SF_6$/Ar/He.

Opening 48 can extent through part or all of layer 42 (see FIG. 5). The thickness $t_1$ of the second insulating layer 42 overlying the fuse 26 is in the range of 0 to 10,000 angstroms and preferably approximately 5000 angstroms. The thickness should be small and tightly controlled to allow the laser irradiation to consistently penetrate the film 42 to consistently melt the fuse without overheating and damaging the surrounding insulating layers 40, 42, 44, 46, and devices.

Figure 6:
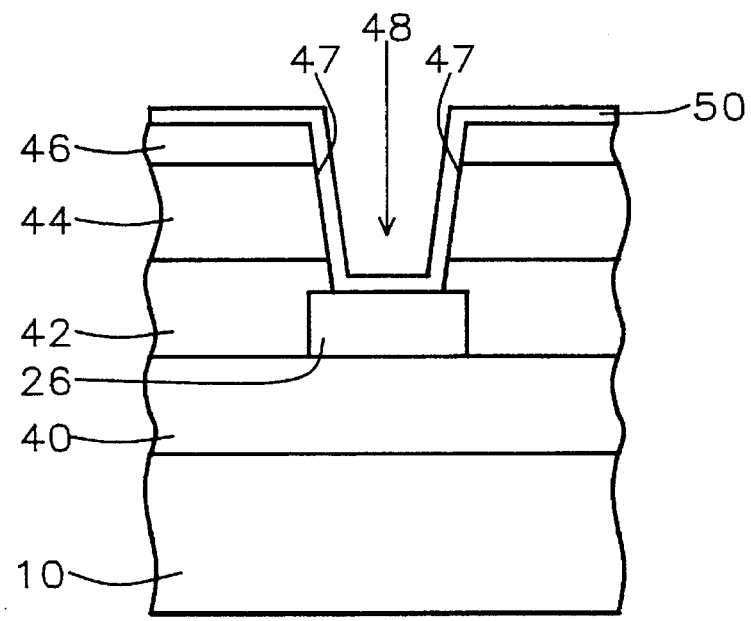

Next, a protective dielectric film 50, which is highly transparent to laser energy, is deposited over the fourth layer 46, the exposed portion of the second 42, and third 46 layers in the opening 48 and the fuse 26 as shown in FIG. 6. Protective film 50 can be formed of plasma enhance chemically deposited (PECVD) silicon nitride.

The protective layer 50 is deposited using a plasma enhanced chemical vapor deposition (PECVD) process by reacting silane ($SiH_4$) and ammonia ($NH_3$) in a nitrogen plasma (PECVD) at a temperature of 200° to 450° C., the ratio of $SiH_4$ to $NH_3$ from 1.3 to 1.6, a pressure range of 2 to 10 torr., an electrode spacing of 560 to 600 mils and a radio frequency (rf) power setting of between 350 to 400 watts. Layer 50 has a thickness in the range of 3000 to 15,000 angstroms and more preferably a thickness of 7000 angstroms. The silicon to nitrogen ratio in protective layer 50 should be in the range of 1.2 to 1.6 and more preferably a ratio of 1.4.

Using the above process, the transmittance of an laser beam through the protective layer 50 should be greater than 50%. Preferably, the transmittance of the laser beam through the protective layer 50 should be greater than 50% at a laser irradiation wavelength in the range of 1037 to 1057 nanometers. The laser used can be a Yumium-Yag laser at wavelength in the range of 1037 to 1057 nanometers and a pulse less than 35 nanoseconds.

In another embodiment of the present invention, protective layer 50 is applied after the laser trimming process. Also, two protective layers can be applied to ensure maximum protection, i.e., a protective layer 50 applied before the laser trimming operation and a second protective layer applied after the laser trimming operation.

This invention has the advantages of reducing contamination which enters through the exposed portion of the insulating layers 42, 44, 46 in the sidewalls 47 of the opening 48 over a fuse 26. The protective layer 50 covers the exposed portions of the insulating layers 42, 44, 46 over the fuse opening sidewalls 47 preventing contamination from entering. In addition to preventing contamination, the protective layer 50 of the present invention is highly transparent to laser irradiation and does not interfere with the laser trimming process.

While the invention has been particularly shown and described with reference to the preferred embodiments thereof, it will be understood by those skilled in the art that various changes in form and details may be made without departing from the spirit and scope of the invention.

What is claimed is:

1. A method of forming a protective layer having a transmittance of laser irradiation covering an opening through insulating layers in a semiconductor device comprising the steps of:

forming a first insulating layer on a semiconductor substrate;

forming a fusible link on said first insulating layer;

forming a second insulating layer at least partially covering said fusible link and said first insulating layer;

forming an opening, over the fusible link, at least partially through the second layer, said opening having a bottom and sidewalls surfaces; and forming a protective layer having between 50% and 100% transmittance to laser irradiation, said protective layer covering said fusible link, said second insulating layer, and the bottom and sidewall surfaces of the opening; said protective layer of silicon nitride having a ratio of silicon to nitride between 1.4 and 1.6.

2. The method of claim 1 wherein the first insulating layer formed of silicon oxide having a thickness in the range from 2000 to 8000 angstroms.

3. The method of claim 1 wherein the second insulating layer is formed of borophosphosilicate glass having a thickness in the range from 3000 to 15,000 angstroms.

4. The method of claim 1 wherein the protective layer is comprised of silicon nitride with a thickness in the range of 3000 to 15,000.

5. The method of claim 1 which further comprises forming the protective layer of silicon nitride by a plasma enhance chemical vapor deposition process by reacting silane with ammonia in a nitrogen plasma, with a silane to ammonia ratio between 1.3 to 1.6, at a pressure range between 2 to 10 Torr, with an electrode spacing between 560 to 600 mils and at a radio frequency power in the range of 350 to 400 watts and the protective layer of silicon nitride having a ratio of silicon to nitride of between 1.2 to 1.6.

6. The method of claim 1 wherein the protective layer is formed of silicon nitride with a transmittance of a laser irradiation of between 50% and 100% for laser irradiation in the wavelengths between 1037 and 1057 nanometers.

7. The method of claim 1 which further comprises at least a third layer and a fourth layer of insulating material formed over the second layer.

8. The method of claim 7 which further comprises forming the third insulating layer of a composite layer including silicon oxide, spin on glass, and silicon oxide having an overall thickness in the range of 7000 to 20,000 angstroms.

9. The method of claim 7 which further comprises forming the third layer of a composite layer of spin on glass and silicon oxide.

10. The method of claim 7 which further comprises forming the fourth insulating layer of silicon nitride having a thickness in the range of 2000 to 10,000 angstroms.

11. The method of claim 7 which further comprises forming the fourth insulating layer of silicon oxide having a thickness in the range of 2000 to 10,000 angstroms.

12. The method of claim 7 which further comprises forming a second protective layer over the insulating layers and the surfaces of the opening, after a laser trimming operation.

13. A method of forming a protective layer having a transmittance of laser irradiation covering an opening through insulating layers in a semiconductor device comprising the steps of:

forming a first insulating layer on a semiconductor substrate;

forming a fusible link on said first insulating layer;

forming a second insulating layer at least partially covering said fusible link and said first insulating layer;

forming an opening, over the fusible link, at least partially through the second layer, said opening having a bottom and sidewalls surfaces; and forming a protective layer having between about 50% to 100% transmittance to laser irradiation, said protective layer covering said fusible link, said second insulating layer, and the bottom and sidewall surfaces of the opening; and forming said protective layer of silicon nitride by a plasma enhance chemical vapor deposition process by reacting silane with ammonia in a nitrogen plasma, with a silane to ammonia ratio between 1.3 to 1.6, at a pressure range between 2 and 10 Torr, with an electrode spacing between 560 and 600 mils and at a radio frequency power in the range of 350 to 400 watts and the protective layer of silicon nitride having a ratio of silicon to nitride of between 1.2 and 1.6.

14. The method of claim 13 wherein the first insulating layer formed of silicon oxide having a thickness in the range from 2000 to 8000 angstroms.

15. The method of claim 13 wherein the second insulating layer is formed of borophosphosilicate glass having a thickness in the range from 3000 to 15,000 angstroms.

16. The method of claim 13 wherein the protective layer is comprised of silicon nitride with a thickness in the range of 3000 to 15,000.

17. The method of claim 13 wherein the protective layer is formed of silicon nitride with a transmittance of a laser irradiation of between 50% and 100% for laser irradiation in the wavelengths between 1037 and 1057 nanometers.

18. The method of claim 13 which further comprises at least a third layer and a fourth layer of insulating material formed over the second layer.

19. The method of claim 18 which further comprises forming the third insulating layer of a composite layer including silicon oxide, spin on glass, and silicon oxide having an overall thickness in the range of 7000 to 20,000 angstroms.

20. The method of claim 18 which further comprises forming the third layer of a composite layer of spin on glass and silicon oxide.

21. The method of claim 18 which further comprises forming the fourth insulating layer of silicon nitride having a thickness in the range of 2000 to 10,000 angstroms.

22. The method of claim 18 which further comprises forming a second protective layer over the insulating layers and the surfaces of the opening, after a laser trimming operation.

* * * * *